(12) United States Patent
Koda (10) Patent No.: US 6,737,681 B2
(45) Date of Patent: May 18, 2004

(54) LIGHT EMITTING DEVICE WITH FLUORESCENT MEMBER EXCITED BY SEMICONDUCTOR LIGHT EMITTING ELEMENT

(75) Inventor: Shigetsugu Koda, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/225,440

(22) Filed: Aug. 22, 2002

(65) Prior Publication Data
US 2003/0038295 A1 Feb. 27, 2003

(30) Foreign Application Priority Data

Aug. 22, 2001 (JP) .................................... P 2001-251407
Aug. 22, 2001 (JP) .................................... P 2001-251423

(51) Int. Cl.[7] .............................................. H01L 33/00
(52) U.S. Cl. ........................... 257/98; 257/95; 313/486
(58) Field of Search ................................... 257/98

(56) References Cited

U.S. PATENT DOCUMENTS 6,284,155 B1 * 9/2001 Rao ........................ 252/301.4
6,469,322 B1 * 10/2002 Srivastava et al. ............. 257/89
6,592,780 B2 * 7/2003 Hohn et al. ............. 252/301.36

FOREIGN PATENT DOCUMENTS

| JP | 10-112557 | 4/1998 |
|---|---|---|
| JP | 10-319877 | 12/1998 |
| JP | 11-087778 | 3/1999 |
| JP | 11-274572 | 10/1999 |
| JP | 000082849 | * 3/2000 |
| JP | 2000-081847 | 3/2000 |
| JP | 2000-082849 | 3/2000 |

* cited by examiner

Primary Examiner—Douglas Wille
(74) Attorney, Agent, or Firm—Morrison & Foerster LLP (57) ABSTRACT

A reflector that functions as a fluorescent member is formed of a transparent resin material including a fluorescent substance dispersed therein capable of emitting light by excitation of light emitted from a semiconductor light emitting element, on the bottom of the case so as to surround the semiconductor light emitting element, having an inner surface of curved surface of concave arc shape having a section extending from the height of the bottom of the case obliquely upward, in a shape that continues along substantially the entire circumference of an oval or elongated round shape, thereby achieving uniform light emission without color heterogeneity, for example, white light of high output power.

46 Claims, 4 Drawing Sheets

LIGHT EMITTING DEVICE WITH FLUORESCENT MEMBER EXCITED BY SEMICONDUCTOR LIGHT EMITTING ELEMENT

BACKGROUND OF THE INVENTION

1. Field of the Invention

This application is to apply for the priority insistence by the assumption of laid open patent JP 2001-251,407 and JP 2001-251423 basic.

The present invention relates to a light emitting device, particularly to a device that can emit uniform light with less color heterogeneity, for example, white light of high output power.

2. Description of the Related Art

Portable electronic devices, sign lamps, indication lamps and other devices are increasingly employing semiconductor light emitting elements, for example, light emitting diode (LED), that have high luminance and low power consumption, as the light sources. When such a semiconductor light emitting element is used to constitute a light emitting device, light emitted by the semiconductor light emitting element that is a point light source must be converted into planar emission of light.

Prior art of achieving planar light emission includes such techniques as a film that contains a light diffusion agent and is mounted in front of a semiconductor light emitting element chip, a lens that is mounted in front of a semiconductor light emitting element chip to control the directivity of light, and an array of semiconductor light emitting element chips arranged with a high density so as to provide quasi planar light emission.

However, the film including the light diffusion agent results in a low light transmissivity due to the light diffusion agent, while the technique using the lens or high density array results in higher manufacturing cost.

On the other hand, it has been proposed to form a reflector around a semiconductor light emitting element so as to reflect a part of the light from the semiconductor light emitting element forward, thereby achieving planar light emission.

Recently, the emission of white light have been increasingly demanded. Devices for emitting white or near white light are often made by using a semiconductor light emitting element that emits blue light and a YAG series fluorescent substance (yttrium aluminum garnet) dispersed in a sealing resin, so that a part of the light from the semiconductor light emitting element is absorbed by the fluorescent substance that in turn emits yellow light through wavelength conversion, and the blue light and the yellow light are blended so as to produce white light.

With this method of mixing the YAG series fluorescent substance in the sealing resin, uniform white light with less color heterogeneity can be produced, although light transmissivity through the sealing resin is lowered by the fluorescent substance, thus making it difficult to achieve a satisfactory optical output power.

In order to overcome such drawbacks, many variations of method of coating a reflector with a YAG series fluorescent substance have been proposed (see Japanese Unexamined Patent Publications (Kokai) No. 10-112557 (1998), No. 10-319877 (1998) (div. No. 2000-81847), No. 11-87778 (1999) (div. No. 2000-82849), No. 11-274572 (1999)).

However, with the structures that have been disclosed in the above patent publications so far, light emitted from the side faces of the semiconductor light emitting element has not been fully utilized.

Also with the structures disclosed in the above patent publications, there is such a problem that light is not fully diffused in a cavity that houses the semiconductor light emitting element, thus resulting in the emission of white light having color heterogeneity with the semiconductor light emitting element emitting bluish light and the reflector emitting yellowish light.

SUMMARY OF THE INVENTION

An object of the present invention is to provide a light emitting device that can emit uniform white light with less color heterogeneity and high output power.

The light emitting device of the invention comprises a semiconductor light emitting element emitting at least part of light from side faces thereof; and a fluorescent member provided at a distance from the semiconductor light emitting element; the fluorescent member being capable of emitting light by wavelength-conversion due to absorption of part of light emitted from the semiconductor light emitting element and including at least yttrium aluminum garnet fluorescent substance as a component having at least one element selected from the group consisting of Y, Lu, Sc, La, Gd and Sm, at least one element selected from the group consisting of Al, Ga and In, at least Ce and at least one element selected from the group consisting of Pr, Sm, Cu, Ag, Au, Fe, Cr, Nd, Dy, Ni, Ti, Tb and Eu; wherein the fluorescent member has a first portion at a first distance from the semiconductor light emitting element and a second portion at a second distance farther than the first distance from the semiconductor light emitting element and the first portion has a higher efficiency of absorption of light emitted from the semiconductor light emitting element than that of the second portion.

Using the above fluorescent substance allows the color of light to obtain high color rendering properties.

In addition, designing the higher efficiency of absorption of light emitted from the semiconductor light emitting element at each portion of the fluorescent member as the portion being at the shorter distance from the semiconductor light emitting element, allows the light emitted from the side faces of the semiconductor light emitting element to be utilized more efficiently. Thus, the ratio in quantity of light wavelength-converted by the fluorescent substance out of light irradiated from the light emitting element becomes substantially uniform over the whole fluorescent member, thereby light of uniform color with high color rendering properties and less color heterogeneity can be emitted.

The light emitting device of the invention also comprises a semiconductor light emitting element emitting at least part of light from side faces thereof; and a fluorescent member provided at a distance from the semiconductor light emitting element; the fluorescent member being capable of emitting light by wavelength-conversion due to absorption of part of light emitted from the semiconductor light emitting element; wherein the fluorescent member has a first portion at a first distance from the semiconductor light emitting element and a second portion at a second distance farther than the first distance from the semiconductor light emitting element and the first portion has a higher efficiency of absorption of light emitted from the semiconductor light emitting element than that of the second portion.

With this constitution, designing the higher efficiency of absorption of light emitted from the semiconductor light emitting element at each portion of the fluorescent member as the portion being at the shorter distance from the semiconductor light emitting element, allows the light emitted from the side faces of the semiconductor light emitting element to be utilized more efficiently. Thus, the ratio in quantity of light wavelength-converted by the fluorescent substance out of light irradiated from the light emitting element becomes substantially uniform over the whole fluorescent member, thereby light of uniform color with high color rendering properties and less color heterogeneity can be emitted.

According to the invention, it is preferable that the fluorescent member is formed of a transparent resin material with a fluorescent substance dispersed therein, and said efficiency of absorption is changed continuously or stepwise correspondingly to the absolute quantity of the fluorescent substance.

The efficiency of absorption at each portion of the fluorescent member is adjustable continuously or stepwise by changing the absolute quantity of the fluorescent substance continuously or stepwise.

According to the invention, it is preferable that the first portion has a higher density of the fluorescent substance in the fluorescent member than that of the second portion.

The efficiency of absorption at each portion of the fluorescent member is also adjustable continuously or stepwise by changing the density of the fluorescent substance continuously or stepwise.

According to the invention, it is preferable that the fluorescent member includes multiple layers stacked, each layer including different kind of fluorescent substance and said efficiency of absorption in each layer is changed correspondingly to the light conversion efficiency of each fluorescent substance.

The efficiency of absorption at each portion of the fluorescent member is also adjustable continuously or stepwise by stacking multiple layers, each of layer including different kind of fluorescent substance and changing the light conversion efficiency of each fluorescent substance.

According to the invention, it is preferable that the fluorescent member contains a fluorescent substance and a light-diffusing agent as components, and said efficiency of absorption is changed correspondingly to the density of the light-diffusing agent.

The efficiency of absorption at each portion of the fluorescent member is also adjustable continuously or stepwise by containing a light-diffusing agent and changing the density of the light-diffusing agent.

According to the invention, it is preferable that the first portion has a higher density of the light-diffusing agent in the fluorescent member than that of the second portion.

Designing the density of the light-diffusing agent at each portion of the fluorescent member as the portion being at the shorter distance from the semiconductor light emitting element, allows the light emitted from the side faces of the semiconductor light emitting element to be utilized more efficiently. Thus, the ratio in quantity of light wavelength-converted by the fluorescent substance out of light irradiated from the light emitting element becomes substantially uniform over the whole fluorescent member, thereby light of uniform color with less color heterogeneity can be emitted.

According to the invention, it is preferable that the fluorescent member is provided near the side faces of the semiconductor light emitting element and has a flat or curved surface that reflects light emitted from the semiconductor light emitting element.

This constitution allows the light emitted from the side faces of the semiconductor light emitting element to reach the fluorescent substance to be utilized for fluorescent substance more efficiently. In addition, the fluorescent member has a flat or curved surface that reflects light emitted from the semiconductor light emitting element, so that the light emitted from the semiconductor light emitting element and the light emitted from the fluorescent substance can be blended efficiently and light of uniform color with less color heterogeneity can be emitted.

According to the invention, it is preferable that the device generate a light mixed with both the visible light emitted from the semiconductor light emitting element and the visible light emitted from the fluorescent substance.

Thus, mixing with both the visible light emitted from the semiconductor light emitting element and the visible light emitted from the fluorescent substance allows the utility efficiency of light to upgrade.

According to the invention, the mixed light is preferably white light, thereby the light emitting device can be used as a back light source for any apparatuses such as illuminating apparatus and signal light.

The light emitting device of the invention also comprises electrodes provided on a base surface; a semiconductor light emitting element that is mounted on the base surface at a distance from the electrodes and emits part of light from side faces thereof; a connecting member that electrically connects the semiconductor light emitting element and the electrodes; and a fluorescent member formed of a transparent resin material with a fluorescent substance dispersed therein, the fluorescent substance capable of emitting light by excitation of the light emitted from the semiconductor light emitting element, the fluorescent member being provided to surround the semiconductor light emitting element; wherein the fluorescent member has a curved surface that reflects the light emitted from the side faces of the semiconductor light emitting element away from the base surface.

One feature of the invention is that the fluorescent member has a curved surface of concave arc that extends from the base surface obliquely upward to the outside at least in the lower portion of the fluorescent member, while the fluorescent member includes a curved surface that reflects the light emitted from the side faces of the semiconductor light emitting element away from the base surface, and the fluorescent member includes a fluorescent member dispersed therein, the fluorescent substance capable of emitting light by excitation of the light emitted from the semiconductor light emitting element.

With this constitution, not only the light emitted obliquely forward from the semiconductor light emitting element but also most of the light emitted from the side faces thereof can reach the fluorescent substance included in the fluorescent member so as to be effectively used by the fluorescent substance to emit light. As a result, light transmissivity can be made higher and a higher optical output power can be achieved than with the conventional structure wherein the sealing resin includes the fluorescent substance dispersed therein.

Also because the lower portion of the fluorescent member has at least the inner surface of the lower portion formed in a curved surface of concave arc, part of the light emitted from the semiconductor light emitting element and most of the light emitted from the side faces are more likely to be diffused in the fluorescent member than in the flat reflector structure, so that the light emitted from the semiconductor light emitting element and the light emitted from the fluorescent substance can be blended efficiently and light of uniform color with less color heterogeneity can be emitted.

While the fluorescent member may have at least the inner surface of the lower portion in the direction of height formed in a curved surface of concave arc, part of the light emitted from the semiconductor light emitting element and most of the light emitted from the side faces can be utilized more efficiently so that optical output power can be increased greatly by forming the fluorescent member over the entire height in a curved surface of concave arc.

Moreover, since the inner edge at the lower end of the fluorescent member is set at the height of the base surface or that of the vicinity thereof, most of the light emitted from the side faces of the semiconductor light emitting element can reach the curved surface. But it is preferable to keep a space between the inner edge at the lower end of the fluorescent member and the side faces of the semiconductor light emitting element which causes all of the light emitted from the side faces of the semiconductor light emitting element to surely reach the curved surface of the fluorescent member, thereby increasing the optical output power more reliably.

According to the invention, the inner surface of the fluorescent member is preferably formed so as to substantially constitute a part of paraboloid of revolution, ellipsoid of revolution or hyperboloid of revolution.

With this constitution, the light emitted from the semiconductor light emitting element can be collected efficiently, while the light emitted from the semiconductor light emitting element and the light emitted from the fluorescent substance can be blended efficiently and the efficiency of utilizing the light is improved.

The light emitting device of the invention also comprises electrodes provided on a base surface; a semiconductor light emitting element that is mounted on the base surface at a distance from the electrodes and emits part of light from side faces thereof; a connecting member that electrically connects the semiconductor light emitting element and the electrodes; and a fluorescent member formed of a transparent resin material with a fluorescent substance dispersed therein, the fluorescent substance capable of emitting light by excitation of the light emitted from the semiconductor light emitting element, the fluorescent member being provided to surround the semiconductor light emitting element; wherein density of the fluorescent substance included in the fluorescent member is changed continuously or stepwise with the height from the base surface.

Another feature of the invention is that the fluorescent member is formed of the transparent resin material and disposed to surround the semiconductor light emitting element, and the fluorescent substance dispersed in the fluorescent member can emit light by excitation of the light emitted from the semiconductor light emitting element, with the density of the fluorescent substance being changed continuously or stepwise with the height from the base surface.

With this constitution, not only the light emitted obliquely forward from the semiconductor light emitting element but also most of the light emitted from the side faces thereof can reach the fluorescent substance included in the fluorescent member so as to be effectively used by the fluorescent substance to emit light. As a result, light transmissivity can be made higher and a higher optical output power can be achieved than with the conventional structure wherein the sealing resin includes the fluorescent substance dispersed therein.

According to the present invention, density of the fluorescent substance in the fluorescent member is preferably made higher as the height from the base surface decreases.

By dispersing the fluorescent substance in the fluorescent member so that the density on the base surface side higher than the density on the surface side, part of the light emitted from the semiconductor light emitting element and most of the light emitted from the side faces are more likely to be diffused than in the conventional structure that is coated with a fluorescent substance. Thus the light emitted from the semiconductor light emitting element and the light emitted from the fluorescent substance can be efficiently blended so as to produce a desired color, and light of uniform color with less color heterogeneity can be produced.

While it suffices to make the density of fluorescent substance higher on the base surface side than on the surface side, such a distribution as the density of fluorescent substance gradually decreases from base surface side to the surface side makes it possible to more efficiently use part of the light emitted from the semiconductor light emitting element and most of the light emitted from the side faces, thereby significantly increasing the optical output power.

According to the invention, the transparent resin material of the fluorescent member is preferably an epoxy resin, silicone resin, amorphous polyamide resin or fluorocarbon. With such a constitution, reliable emission of light by the fluorescent substance dispersed in the material can be achieved.

Also according to the invention, the fluorescent substance in the fluorescent member is preferably yttrium aluminum garnet (YAG) series.

In the present invention various fluorescent substances such as inorganic or organic fluorescent substance may be included in the fluorescent member. For example, an inorganic fluorescent substance containing a rare earth element, specifically, a fluorescent substance of garnet structure having at least one element selected from the group consisting of Y, Lu, Sc, La, Gd and Sm, and at least one element selected from the group consisting of Al, Ga and In is available. More specifically, a fluorescent substance of yttrium aluminum oxide activated by Ce is preferable, if required, Pr, Sm, Cu, Ag, Au, Fe, Cr, Nd, Dy, Ni, Ti, Tb and/or Eu may be contained with Ce. Particularly, a fluorescent substance containing both Ce and Pr can emit the color of light with high color rendering properties.

When a light emitting diode having light emitting layer made of gallium nitride semiconductor that has a high band gap energy is used for the semiconductor light emitting element, for example, a fluorescent substance activated with divalent europium having chemical composition of $(M_{1-p-q}Eu_pQ_q)O \cdot n(Al_{1-m}B_m)_2O_3$ is preferably used as described in Japanese Unexamined Patent Publication (Kokai) No. 10-112557 filed by the present applicant. The proportions of the elements are $0.0001 \leq p \leq 0.5$, $0.0001 \leq q \leq 0.5$, $0.5 \leq n \leq 10$, $0 \leq m \leq 0.5$, and $0.0002 \leq p+q \leq 0.75$. In the chemical formula described above, M represents at least one element selected from the group of divalent metals consisting of Mg, Ca, Sr, Ba and Zn, Q represents a co-activating agent that is at least one element selected from the group consisting of Mn, Zr, Nb, Pr, Nd, Gd, Th, Dy, Er, Tm, Yb and Lu.

When the fluorescent substance having the composition described above is used, the fluorescent substance will not deteriorate even after emitting light that has high energy in the visible region for a long period of time, thus ensuring a desired luminance and after glow over a long period of time.

Also according to the invention, the fluorescent substance included in the fluorescent member is preferably a nitride fluorescent substance that includes nitrogen at least in the fundamental elements.

An example of nitride fluorescent substance that can be used is one that includes fundamental constituent elements in composition of $L_xM_yN_{(2X/3+4Y/3)}$:Z (L represents at least one element selected from the group of divalent elements consisting of Be, Mg, Ca, Sr, Ba, Zn, Cd, Hg, M represents at least one element selected from IV group elements consisting of C, Si, Ge, Sn, Ti, Zr, Hf, and Z represents at least one element selected from a group of elements consisting of Eu, Cr, Mn, Pb, Sb, Ce, Tb, Pr, Sm, Tm, Ho, Er, Yb, Nd) and at least one additional element selected from the group consisting of Mg, Sr, Ba, Zn, B, Al, Cu, Mn, Cr, O and Fe. Such a nitride fluorescent substance allows it to regulate the particle size and improve the luminance of light emission because of the additional elements included therein. B, Mg, Cr, Ni and Al have the effect of suppressing the after glow.

The fluorescent substance may be used in a single kind or mixture of two or more kinds. When two or more kinds of fluorescent substance are used, it is preferable that they emit light of colors that are complementary to each other.

In one embodiment, the light emitting device comprises a semiconductor light emitting element that emits first light, a first fluorescent substance that is excited by a part of the first light so as to emit second light, and a second fluorescent substance that is excited by a part of the first light so as to emit third light. For example, with a constitution employing a semiconductor light emitting element that emits light of a bluish color (dominant wavelength 455 nm) and a fluorescent member including $Y_3(Al_{0.8}Ga_{0.2})_5O_{12}$:Ce that is excited by light of wavelength (excitation wavelength 440 nm) shorter than the dominant wavelength of the semiconductor light emitting element so as to emit greenish light (dominant wavelength 530 nm) as the first fluorescent substance, and $(Sr_{0.679}Ca_{0.291}Eu_{0.03})_2Si_5N_8$ that has an excitation wavelength substantially the same as that of the first fluorescent substance and emits reddish light (dominant wavelength 650 nm) as the second fluorescent substance, a light emitting device that emits warm white light with high color rendering properties by blending the light of the three wavelengths (bluish, greenish and reddish colors).

Incidentally, the term "white color" in the present specification means a color classified in the white regions of the "Appendix Diagram 1, General Chromaticity Regions corresponding to Name of System Color, defined by JIS Z8110-1995".

A light emitting device that emits warm white light can also be made by combining a semiconductor light emitting element that emits light in ultraviolet region and a plurality of fluorescent substances that absorb the ultraviolet ray and emit visible light, and blending the light emitted by the different fluorescent substances.

In case a plurality of fluorescent substances are used to form multiple layers of color conversion wherein multiple color conversion thin films, each including different kind of fluorescent substance, are stacked, it is preferable to set the ultraviolet ray transmissivity of an upper layer higher than that of a lower layer that is on the substrate side, while giving consideration to the ultraviolet ray transmissivity of each fluorescent substance.

Median particle size of the fluorescent substance included in an upper layer is preferably smaller than that of a lower layer that is on the substrate side. With this arrangement, the fluorescent substance included in the topmost layer can be efficiently irradiated with ultraviolet ray, and the ultraviolet ray can be prevented from leaking to the outside of the device.

When the red light emitting fluorescent substance, the blue light emitting fluorescent substance and the green light emitting fluorescent substance described above are used, for example, it is preferable to stack the red light emitting fluorescent substance on the substrate, then the green light emitting fluorescent substance and in turn the blue light emitting fluorescent substance thereon. Median particle size of the fluorescent substance is preferably largest in the red light emitting fluorescent substance, smaller in the green light emitting fluorescent substance and smallest in the blue light emitting fluorescent substance.

According to the invention, it is preferable that the fluorescent member includes a pigment having a body color similar to the color of light emitted from the fluorescent substance. For example, color of emitted light can be made clearer by using a pigment that can shut off light in a region of the emission spectrum of the semiconductor light emitting element that is not the complementary color of the light emitted from the light emitting device or light that does not contribute to the excitation of the fluorescent substance. In this case, the effect can be made higher by setting the body color of the pigment similar to that of light emitted by the fluorescent substance.

In order to have the fluorescent substance dispersed in the fluorescent member, it is preferable to use such a synthetic resin having viscosity that may harden while keeping the fluorescent substance from precipitating in the resin, so that all of the fluorescent substance does not precipitate in the lower portion of the reflector.

The fluorescent member is preferably formed of a transparent synthetic resin material that has viscosity in a range from 2,500 mPa·s to 20,000 mPa·s, preferably from 3,000 mPa·s to 10,000 mPa·s, more preferably from 4,000 mPa·s to 8,000 mPa·s.

While quantity of the fluorescent substance may be determined according to the wavelength and intensity of light emitted from the semiconductor light emitting element and other condition, it is preferable to mix 40 to 300 parts by weight, preferably 40 to 200 parts by weight, more preferably 40 to 100 parts by weight of the fluorescent substance with 100 parts by weight of the synthetic resin material.

While efficiency of the fluorescent substance to emit light by excitation of the light emitted from the semiconductor light emitting element becomes higher as the particle size of the fluorescent substance is larger, larger fluorescent substance particles are more likely to precipitate in the lower portion of the fluorescent member. Therefore, mean particle size of the fluorescent substance included in the fluorescent member is preferably in a range from 6 to 25 µm as measured by Fischer's method.

While the curved surface of the fluorescent member may be formed by chemical process such as etching, it may also be formed spontaneously by potting a transparent resin material including the fluorescent substance mixed therein, which leads to simplified manufacturing process and lower cost.

According to the invention, it is preferable to seal the semiconductor light emitting element with a sealing resin. There is not particular restriction on the sealing resin as long as it is transparent and, for example, epoxy resin, silicone resin, amorphous polyamide resin or fluorocarbon may be used.

When a resin layer that contains a light-diffusing agent is provided above the semiconductor light emitting element by coating or other process, color heterogeneity can be prevented more reliably and light of uniform color can be emitted. For the light-diffusing agent, one or more selected from among barium titanate, titanium oxide, aluminum oxide, silicon oxide, calcium carbonate, white carbon, talc and magnesium carbonate may be used.

When a light collecting member such as single lens or Fresnel lens is provided above the semiconductor light emitting element, desired directivity of light can be easily achieved and the light emitting device can be used as a back light source for any apparatuses such as illuminating apparatus and signal light. Use of a Fresnel lens as the light collecting member enables it to build a thin light emitting device.

BRIEF DESCRIPTION OF THE DRAWINGS

Objects, features and advantages of the present invention will be more apparent from the detailed description that follows and the accompanying drawings.

DETAILED DESCRIPTION OF THE PREFERRED EMBODIMENTS

Now the present invention will be described in detail below with reference to the accompanying drawings.
(Embodiment 1)

Figure 1:
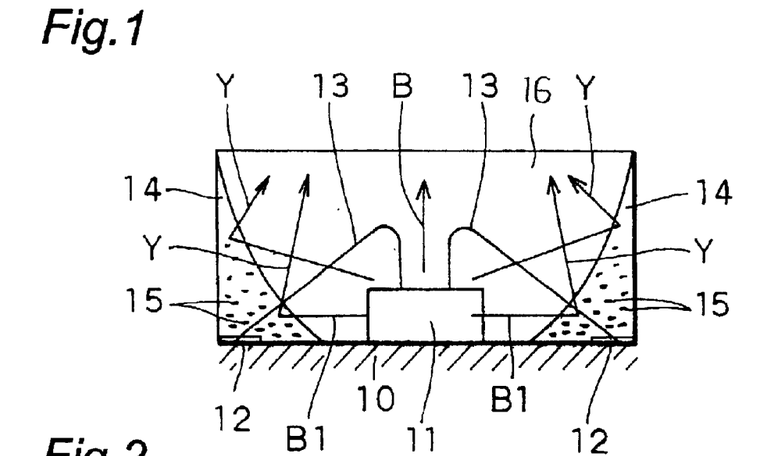
FIG. 1 is a sectional view showing a first embodiment of the invention.

FIG. 1 shows a first embodiment of the invention. In FIG. 1, a semiconductor light emitting element 11 is mounted and electrodes 12, 12 are provided on the bottom (base surface) of a case 10, while electrodes (not shown) of the semiconductor light emitting element 11 and the electrodes 12, 12 provided on the bottom of the case 10 are wire-bonded with each other by means of wires 13, 13.

A reflector 14 that functions as a fluorescent member is formed on the bottom of the case 10 so as to surround the semiconductor light emitting element 11. The reflector 14 is formed of a transparent resin material, and has an inner surface of curved surface of concave arc shape having a section extending from the height of the bottom of the case 10 obliquely upward, in a shape that continues along substantially the entire circumference of an oval or elongated round shape.

The inner surface of the reflector 14 may also be formed so as to substantially constitute a part of paraboloid of revolution, ellipsoid of revolution or hyperboloid of revolution.

The reflector 14 includes a YAG series fluorescent substance 15 capable of emitting light by excitation of the light emitted from the semiconductor light emitting element 11, in such a density of dispersion that gradually decreases from the bottom of the case 10 toward the surface in the direction of height of the reflector 14.

When manufacturing the light emitting device of the present emdobiment, for example, the semiconductor light emitting element 11 including gallium nitride semiconductor in the light emitting layer is die-bonded on bottom of the case 10 by using a resin such as epoxy resin, and the electrodes of the semiconductor light emitting element 11 and the electrodes 12, 12 provided on the bottom of the case 10 are wire-bonded with each other by means of, for example, gold wires 13, 13, so as to establish electrical conductivity. Method for manufacturing the semiconductor light emitting element 11 is similar to the well-known method, and therefore detailed description thereof will be omitted.

A YAG series fluorescent substance having mean particle size in a range from 6 to 25 μm is used for the fluorescent substance 15, and 40 to 100 parts by weight of the fluorescent substance is mixed with 100 parts by weight of a transparent epoxy resin, transparent silicone resin, transparent amorphous polyamide resin or transparent fluorocarbon that has viscosity in a range from 2,500 mPa·s to 20,000 mPa·s, preferably from 3,000 mPa·s to 10,000 mPa·s, more preferably from 4,000 mPa·s to 8,000 mPa·s, thereby to prepare the material of the reflector 14.

In order that the light emitting device can emit white light, for example, the semiconductor light emitting element 11 that emits blue light is used, and 50 parts by weight of the YAG:Ce fluorescent substance that is excited by the blue light so as to emit yellow light and has mean particle size of 7 μm is mixed with 100 parts by weight of a silicone resin having viscosity of 4,000 mPa·s, thereby to prepare the material of the reflector 14. After the material of the reflector 14 has been prepared, the material is potted on the top of the side wall of the case along the circumference. As the resin flows downward and hardens, the reflector 14 having the inner surface shown in FIG. 1 is made.

The reflector 14 has curved surface of concave arc shape having a section extending from the height of the bottom of the case 10 obliquely upward, in a shape that continues along substantially the entire circumference of an oval or elongated round shape. A gap is formed between the inner edge at the bottom of the reflector 14 and the edge at the side of the semiconductor light emitting element 11. While the fluorescent substance 15 precipitates as the resin flow down, viscosity of the resin impedes the precipitation and, when the resin has hardened, the fluorescent substance is dispersed such that the density decreases gradually from the lower portion of the reflector 14 toward the surface as shown in FIG. 1.

Last, the semiconductor light emitting element 11, the electrodes 12, 12 and the gold wires 13, 13 are sealed with a sealing resin 16 such as silicone resin, thus completing the light emitting device of this embodiment. Thus since the reflector 14 can be formed easily with the simple process of potting, a productivity far higher than that for the light emitting device of the prior art having a flat reflector can be achieved.

When blue light B is emitted from the semiconductor light emitting element 11, one part of the light is radiated forward and another part is directed toward the curved surface of the reflector 14, so as to excite the fluorescent substance 15 included in the reflector 14 to radiate yellow light Y all around. Blue light B1 emitted also from the side faces of the semiconductor light emitting element 11 is directed toward the curved surface of the reflector 14 so as to excite the fluorescent substance 15 included in the reflector 15 to radiate yellow light Y all around from the fluorescent substance 15, while the blue light B and the yellow light Y are blended to emit white light in front of the light emitting device.

Since the yellow light is emitted with a output power relatively lower than that of the blue light, emitting light of a desired color with desired output power requires it to increase the thickness of the fluorescent substance 15 or increase the distance along the inner surface of the reflector 14. Since the inner surface of the reflector 14 is formed in a curved surface in the light emitting device of this embodiment, distance along the inner surface can be made larger than that in the light emitting device of the prior art having a flat reflector for a given cavity depth, thus making it possible to make the light emitting device smaller with the same performance.

In the light emitting device of this embodiment, as described above, the light emitted obliquely forward from the semiconductor light emitting element 11 and most of the light emitted from the side faces can reach the fluorescent substance 15 included in the reflector 14 and effectively excites the fluorescent substance to emit light. Moreover, since the fluorescent substance is not dispersed in the sealing resin 16, light transmissivity is high and therefore high optical output power can be achieved.

Figure 2:
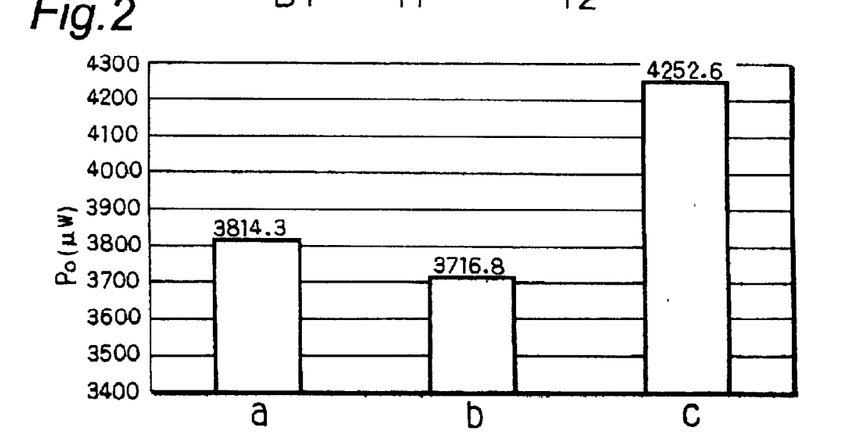
FIG. 2 is a graph comparing the optical output power.

As shown in FIG. 2, it has been verified that optical output power (c) of the light emitting device of this embodiment is significantly higher than both of the optical output power (a) of the light emitting device that has YAG series fluorescent substance dispersed in the sealing resin and the optical output power (b) of the light emitting device that has the fluorescent substance precipitated at the bottom of the cavity.

Also because the reflector 14 has a curved surface, the light emitted obliquely from the semiconductor light emitting element 11 and the light emitted from the side faces are reflected all around, and therefore light is more likely to be diffused than in a flat reflector structure, thereby achieving light emission with uniform color and less color heterogeneity.

(Embodiment 2)

Figure 3:
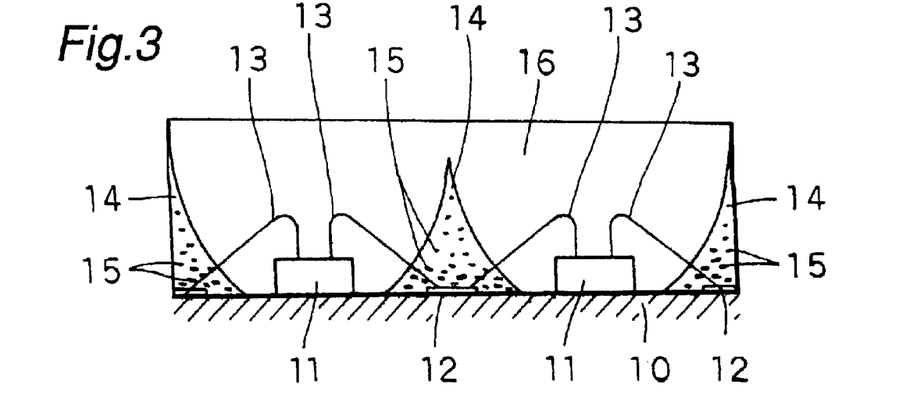
FIG. 3 is a sectional view showing a second embodiment of the invention.

FIG. 3 shows the second embodiment of the invention. In this embodiment, a plurality of semiconductor light emitting elements 11 are mounted in any desired arrangement on the bottom of the case 10, and reflectors 14 are formed so as to surround the semiconductor light emitting elements 11. A plurality of the structure of the first embodiment may be arranged in an array in this way.

(Embodiment 3)

Figure 4:
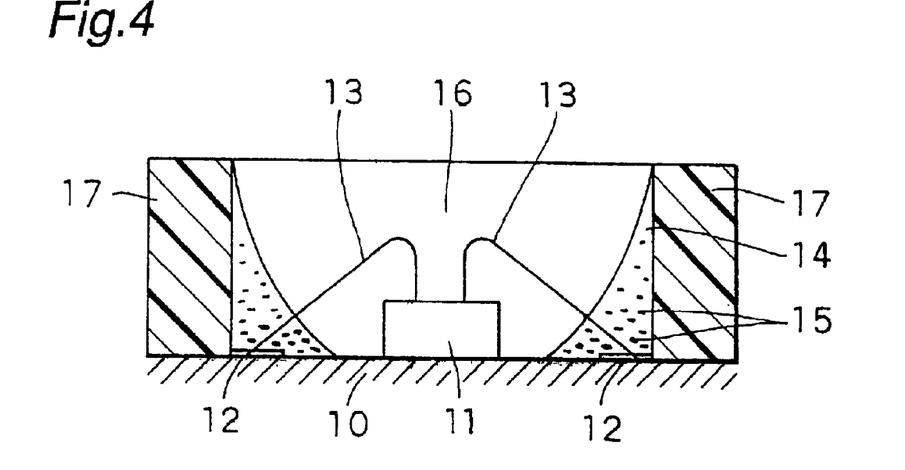
FIG. 4 is a sectional view showing a third embodiment of the invention.

FIG. 4 shows the third embodiment of the invention. In this embodiment, a cavity wall 17 is formed from a synthetic resin material on the bottom of the case 10, the semiconductor light emitting element 11 is mounted on the bottom of the case 10 surrounded by the cavity wall 17, while the reflector 14 is formed through potting by using the cavity wall 17.

(Embodiment 4)

Figure 5:
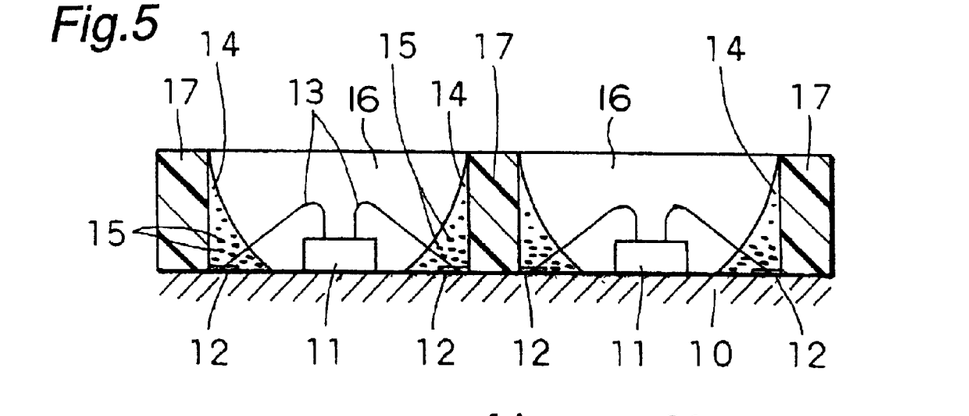
FIG. 5 is a sectional view showing a fourth embodiment of the invention.

FIG. 5 shows the fourth embodiment of the invention. In this embodiment, a plurality of cavity walls 17 are formed from a synthetic resin material in any desired arrangement on the bottom of the case 10, the semiconductor light emitting element 11 is mounted on the bottom of the case 10 surrounded by each of the cavity walls 17, while the reflector 14 is formed through potting by using the cavity walls 17. A plurality of the structure of the third embodiment may be arranged in an array in this way.

(Embodiment 5)

Figure 6:
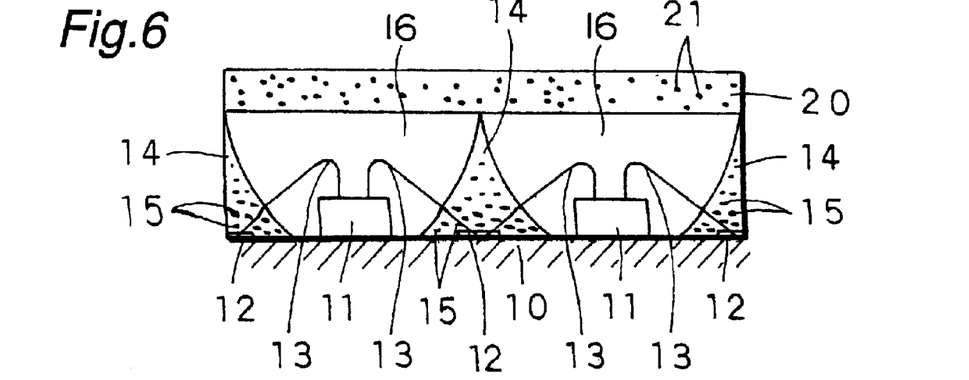
FIG. 6 is a sectional view showing a fifth embodiment of the invention.

FIG. 6 shows the fifth embodiment of the invention. In this embodiment, a diffusion layer 20 including a light-diffusing agent 21 dispersed in a transparent resin material as noted above is formed in front of the light emitting device of the second embodiment. With this structure, light emitted from the semiconductor light emitting element 11 and light emitted from the fluorescent substance 15 are blended more thoroughly in the diffusion layer 20 thereby further preventing color heterogeneity from occurring.

The diffusion layer 20 may also be formed in the light emitting device that has the structure of the first, third or fourth embodiment.

(Embodiment 6)

Figure 7:
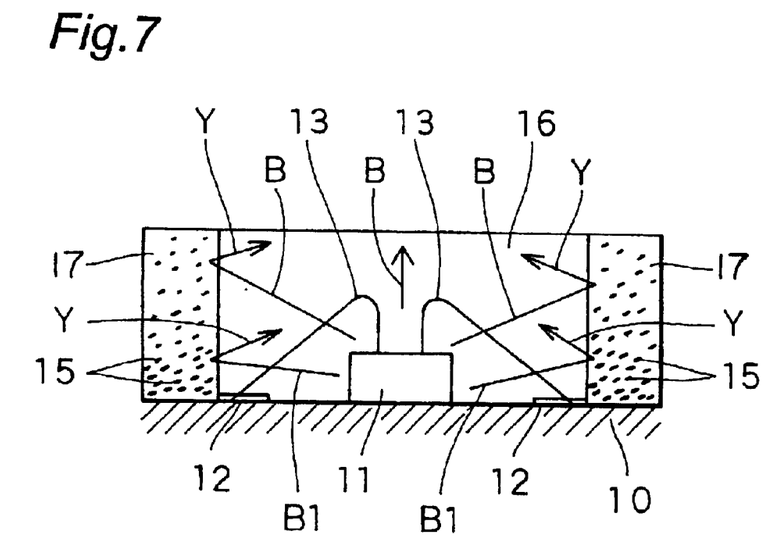
FIG. 7 is a sectional view showing a sixth embodiment of the invention.

FIG. 7 shows the sixth embodiment of the invention. In FIG. 7, a semiconductor light emitting element 11 is mounted and electrodes 12, 12 are provided on a bottom (base surface) of a case 10, while electrodes (not shown) of the semiconductor light emitting element 11 and the electrodes 12, 12 provided on the bottom of the case 10 are wire-bonded with each other by means of wires 13, 13.

Formed on the bottom of the case 10 is a cavity wall 17 that functions as a fluorescent member so as to surround the semiconductor light emitting element 11 and the electrodes 12, 12. The cavity wall 17 is formed of a transparent resin material and includes YAG series fluorescent substance 15 capable of emitting light by excitation of the light emitted from the semiconductor light emitting element 11, in such a density of dispersion that gradually decreases from the bottom of the case 10 toward the surface in the direction of height of the cavity wall 17.

When manufacturing the light emitting device of this embodiment, for example, the semiconductor light emitting element 11 including gallium nitride semiconductor in the light emitting layer is die-bonded on the bottom of the case 10 by using a resin such as epoxy resin, and the electrodes of the semiconductor light emitting element 11 and the electrodes 12, 12 provided on the bottom of the case 10 are wire-bonded with each other by means of, for example, gold wires 13, 13, so as to establish electrical conductivity. Method for manufacturing the semiconductor light emitting element 11 is similar to the well-known method, and therefore detailed description thereof will be omitted.

A YAG series fluorescent substance having mean particle size in a range from 6 to 25 $\mu$m is used for the fluorescent substance 15, and 40 to 100 parts by weight of the fluorescent substance is mixed with 100 parts by weight of a transparent epoxy resin, transparent silicone resin, transparent amorphous polyamide resin or transparent fluorocarbon that has viscosity in a range from 2,500 mPa·s to 20,000 mPa·s, preferably from 3,000 mPa·s to 10,000 mPa·s, more preferably from 4,000 mPa·s to 8,000 mPa·s, thereby to prepare the material of the cavity wall 17.

In order that the light emitting device can emit white light, for example, the semiconductor light emitting element 11 that emits blue light is used, and 50 parts by weight of the YAG:Ce fluorescent substance that is excited by the blue light so as to emit yellow light and has mean particle size of 7 $\mu$m is mixed with 100 parts by weight of a silicone resin having viscosity of 4,000 mPa·s, thereby to prepare the material of the cavity wall 17.

Figure 8A:
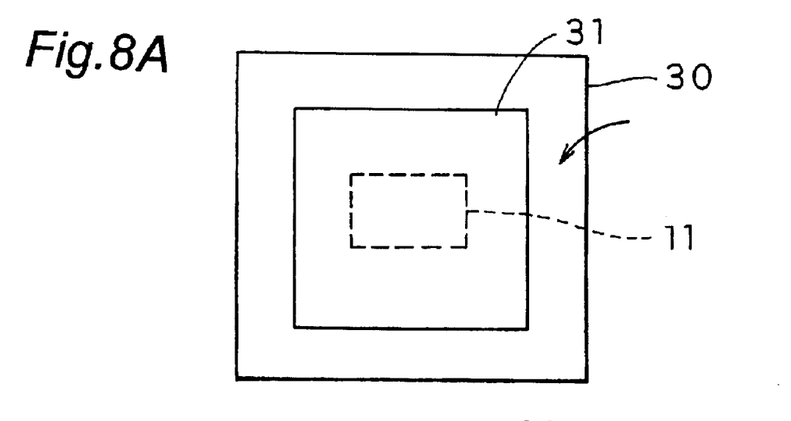
FIG. 8A is a plan view schematically showing a method for manufacturing a wall portion of cavity according to the embodiment shown in FIG. 7.
Figure 8B:
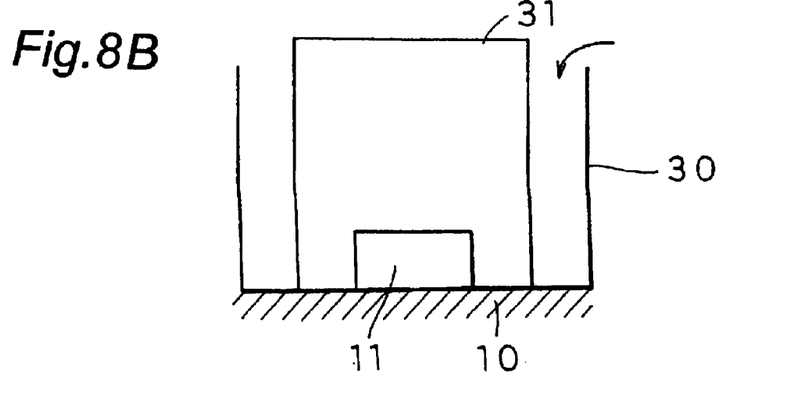
FIG. 8B is a schematic sectional view thereof.

After the material of the cavity wall 17 has been prepared, a molding wall 30 is provided on the bottom of the case 10 as shown in FIGS. 8A and 8B, and a metal box 31 is placed on the bottom of the case 10 so as to enclose the semiconductor light emitting element 11 and the electrodes 12, 12. Then as the material of the cavity wall 17 is poured into the space between the members 30 and 31, the space between the molding wall 30 and the metal box 31 is filled with the material.

While the cavity wall 17 is obtained as the material that has been poured hardens, viscosity of the synthetic resin material causes the fluorescent substance 15 to be dispersed such that the density decreases gradually from the base surface 10 toward the surface.

Last, the semiconductor light emitting element 11, the electrodes 12, 12 and the gold wires 13, 13 are sealed with a sealing resin 16 such as silicone resin, thus completing the light emitting device of this embodiment.

When blue light B is emitted from the semiconductor light emitting element 11, one part of the light is radiated forward and another part is directed toward the cavity wall 17, so as to excite the fluorescent substance 15 included in the cavity wall 17 to radiate yellow light Y all around from the fluorescent substance 15. Blue light B1 emitted also from the side faces of the semiconductor light emitting element 11 is directed toward the cavity wall 17, so as to excite the fluorescent substance 15 included in the cavity wall 17 to radiate yellow light Y all around from the fluorescent substance 15, while the blue light B and the yellow light Y are blended to emit white light in front of the light emitting device.

In the light emitting device of this embodiment described above, the light emitted obliquely from the semiconductor light emitting element 11 and most of the light emitted from the side faces can reach the fluorescent substance 15 included in the cavity wall 17 and efficiently excites the fluorescent substance to emit light. Moreover, since the fluorescent substance is not dispersed in the sealing resin 16, light transmissivity is high and therefore high optical output power can be achieved.

Also because the fluorescent substance 15 is dispersed in the cavity wall 17 in such a distribution as the density decreases gradually from the base surface 10 toward the surface, the cavity wall 17 has substantially the same effect on the light emitted from the semiconductor light emitting element 11 as that of the cavity wall having a curved shape in the inner surface. Since the light emitted obliquely from the semiconductor light emitting element 11 and the light emitted from the side faces are radiated all around from the cavity wall 17, the light is more easily diffused than in the cavity structure coated with the fluorescent substance, thereby achieving light emission with uniform color and less color heterogeneity.

(Embodiment 7)

A light emitting device in this embodiment is manufactured in the same manner as the sixth embodiment by stacking multiple layers of fluorescent substances, each layer having a different light conversion efficiency each other, instead of adjusting the density of the fluorescent substance 15 included in the cavity wall 17 that functions as a fluorescent member. This light emitting device has an advantage similar to that of the sixth embodiment. For example, first portion of the cavity wall 17 at a shorter distance from the the semiconductor light emitting element 11 may be formed of first fluorescent substance having more content of activating agent and second portion of the cavity wall 17 at a farther distance from the the semiconductor light emitting element 11 than the first portion may be formed of second fluorescent substance having less content of activating agent than the first fluorescent substance. This allows the efficiency of absorption of light emitted from the semiconductor light emitting element 11 at the first portion to be higher than that of the second portion.

(Embodiment 8)

A light emitting device in this embodiment is manufactured in the same manner as the sixth embodiment by adjusting the density of the light-diffusing agent included in the cavity wall 17, instead of adjusting the density of the fluorescent substance 15 included in the cavity wall 17 that functions as a fluorescent member. This light emitting device has an advantage similar to that of the sixth embodiment. For example, first portion of the cavity wall 17 at a shorter distance from the the semiconductor light emitting element 11 may have a higher density of the light-diffusing agent than second portion of the cavity wall 17 at a farther distance from the the semiconductor light emitting element 11 than the first portion. This allows the efficiency of absorption of light emitted from the semiconductor light emitting element 11 at the first portion to be higher than that of the second portion.

(Embodiment 9)

Figure 9:
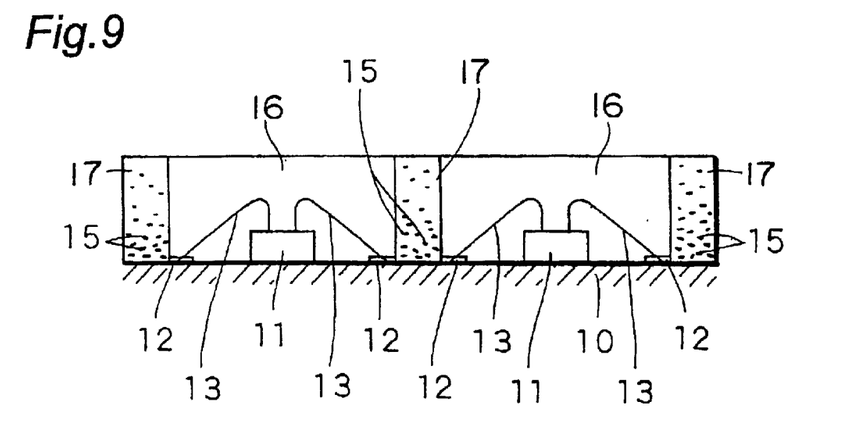
FIG. 9 is a sectional view showing a ninth embodiment of the invention.

FIG. 9 shows the ninth embodiment of the invention. In this embodiment, a plurality of semiconductor light emitting elements 11 are mounted in any desired arrangement on the bottom of the case 10, and cavity walls 17 are formed so as to surround the semiconductor light emitting elements 11 and the electrodes 12, 12. A plurality of the structure of the sixth embodiment may be arranged in an array in this way.

(Embodiment 10)

Figure 10:
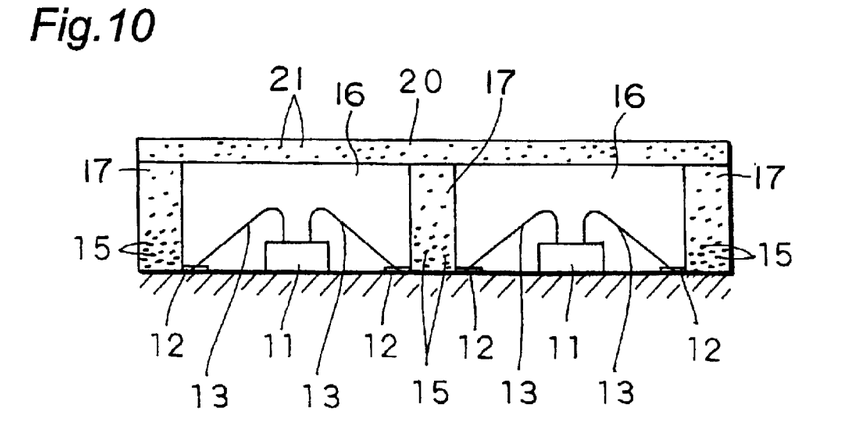
FIG. 10 is a sectional view showing an tenth embodiment of the invention.

FIG. 10 shows the tenth embodiment of the invention. In this embodiment, a diffusion layer 20 including a light-diffusing agent 21 dispersed in a transparent resin material as noted above is formed in front of the light emitting device of the ninth embodiment. With this structure, light emitted from the semiconductor light emitting element 11 and light emitted from the fluorescent substance 15 are blended more thoroughly in the diffusion layer 20 thereby further preventing color heterogeneity from occurring. The diffusion layer 20 may also be formed in the light emitting device that has the structure of the sixth embodiment.

In the embodiments described above, density of fluorescent substance in the fluorescent member such as the reflector and cavity wall is continuously varied with the height from the base surface, although the density may also be changed stepwise.

In the embodiments described above, two or more kinds of fluorescent substance may be mixed in the fluorescent member such as the reflector and cavity wall, white light can be produced through blending by selecting fluorescent substances that emit light of complementary colors such as the red light emitting fluorescent substance, the green light emitting fluorescent substance and the blue light emitting fluorescent substance.

In the embodiments described above, the fluorescent member such as the reflector and cavity wall may also include a pigment having a body color similar to the color of light emitted from the fluorescent substance.

Also in the embodiments described above, a light collecting member such as single lens or Fresnel lens may be provided on the light emitting surface of the light emitting device.

The present invention may be implemented in various other embodiments without deviating from the spirit, concept and scope of the invention. Therefore it should be noted that the embodiments described herein are mere examples in all aspects and do not restrict the scope of the invention that is defined in the claims. Also it should be noted that any variations and modification of the invention that fall in the scope of the claims are included in the scope of the invention.

What is claimed is:

1. A light emitting device comprising:
  a semiconductor light emitting element emitting at least part of light from side faces thereof; and
  a fluorescent member provided at a distance from the semiconductor light emitting element; the fluorescent member being capable of emitting light by wavelength-conversion due to absorption of part of light emitted from the semiconductor light emitting element and including at least yttrium aluminum garnet fluorescent substance as a component having at least one element selected from the group consisting of Y, Lu, Sc, La, Gd and Sm, at least one element selected from the group consisting of Al, Ga and In, at least Ce and at least one element selected from the group consisting of Pr, Sm, Cu, Ag, Au, Fe, Cr, Nd, Dy, Ni, Ti, Th and Eu;
  wherein the fluorescent member has a first portion at a first distance from the semiconductor light emitting element and a second portion at a second distance farther than the first distance from the semiconductor light emitting element and the first portion has a higher efficiency of absorption of light emitted from the semiconductor light emitting element than that of the second portion.

2. A light emitting device comprising:
  a semiconductor light emitting element emitting at least part of light from side faces thereof; and
  a fluorescent member provided at a distance from the semiconductor light emitting element; the fluorescent member being capable of emitting light by wavelength-conversion due to absorption of part of light emitted from the semiconductor light emitting element;
  wherein the fluorescent member has a first portion at a first distance from the semiconductor light emitting element and a second portion at a second distance farther than the first distance from the semiconductor light emitting element and the first portion has a higher efficiency of absorption of light emitted from the semiconductor light emitting element than that of the second portion.

3. The light emitting device of claim 2, wherein the fluorescent member is formed of a transparent resin material with a fluorescent substance dispersed therein, and said efficiency of absorption is changed continuously or stepwise correspondingly to the absolute quantity of the fluorescent substance.

4. The light emitting device of claim 3, wherein the first portion has a higher density of the fluorescent substance in the fluorescent member than that of the second portion.

5. The light emitting device of claim 2, wherein the fluorescent member includes multiple layers stacked, each layer including different kind of fluorescent substance and said efficiency of absorption in each layer is changed correspondingly to the light conversion efficiency of each fluorescent substance.

6. The light emitting device of claim 2, wherein the fluorescent member contains a fluorescent substance and a light-diffusing agent as components, and said efficiency of absorption is changed correspondingly to the density of the light-diffusing agent.

7. The light emitting device of claim 6, wherein the first portion has a higher density of the light-diffusing agent in the fluorescent member than that of the second portion.

8. The light emitting device of claim 2, wherein the fluorescent member is provided near the side faces of the semiconductor light emitting element and has a flat or curved surface that reflects light emitted from the semiconductor light emitting element.

9. The light emitting device of claim 2, wherein the device generate a light mixed with both the visible light emitted from the semiconductor light emitting element and the visible light emitted from the fluorescent substance.

10. The light emitting device of claim 9, wherein the mixed light is white light.

11. A light emitting device comprising:
  electrodes provided on a base surface;
  a semiconductor light emitting element that is mounted on the base surface at a distance from the electrodes and emits part of light from side faces thereof;
  a connecting member that electrically connects the semiconductor light emitting element and the electrodes; and
  a fluorescent member formed of a transparent resin material with a fluorescent substance dispersed therein, the fluorescent substance capable of emitting light by excitation of the light emitted from the semiconductor light emitting element, the fluorescent member being provided to surround the semiconductor light emitting element;
  wherein the fluorescent member has a curved surface that reflects the light emitted from the side faces of the semiconductor light emitting element away from the base surface, and
  the fluorescent member has a first portion at a first distance from the semiconductor light emitting element and a second portion at a second distance farther than the first distance from the semiconductor light emitting element, and the first portion is thicker than the second portion and the first and second portions have a common continuous surface.

12. The light emitting device of claim 11, wherein the inner surface of the fluorescent member is formed so as to substantially constitute a part of paraboloid of revolution, ellipsoid of revolution or hyperboloid of revolution.

13. A light emitting device comprising:
  electrodes provided on a base surface;
  a semiconductor light emitting element that is mounted on the base surface at a distance from the electrodes and emits part of light from side faces thereof;
  a connecting member that electrically connects the semiconductor light emitting element and the electrodes; and
  a fluorescent member formed of a transparent resin material with a fluorescent substance dispersed therein, the fluorescent substance capable of emitting light by excitation of the light emitted from the semiconductor light emitting element, the fluorescent member being provided to surround the semiconductor light emitting element;
  wherein density of the fluorescent substance included in the fluorescent member is changed continuously or stepwise with the height from the base surface.

14. The light emitting device of claim 13, wherein density of the fluorescent substance in the fluorescent member is made higher as the height from the base surface decreases.

15. The light emitting device of claim 11, wherein the transparent resin material of the fluorescent member is an epoxy resin, silicone resin, amorphous polyamide resin or fluorocarbon.

16. The light emitting device of claim 13, wherein the transparent resin material of the fluorescent member is an epoxy resin, silicone resin, amorphous polyamide resin or fluorocarbon.

17. The light emitting device of claim 11, wherein the fluorescent substance in the fluorescent member is yttrium aluminum garnet (YAG).

18. The light emitting device of claim 13, wherein the fluorescent substance in the fluorescent member is yttrium aluminum garnet (YAG).

19. The light emitting device of claim 11, wherein the fluorescent substance in the fluorescent member is a nitride fluorescent substance that includes nitrogen at least in the fundamental elements.

20. The light emitting device of claim 13, wherein the fluorescent substance in the fluorescent member is a nitride fluorescent substance that includes nitrogen at least in the fundamental elements.

21. The light emitting device of claim 11, wherein the fluorescent substance in the fluorescent member is a mixture of two or more kinds of the fluorescent materials.

22. The light emitting device of claim 13, wherein the fluorescent substance in the fluorescent member is a mixture of two or more kinds of the fluorescent materials.

23. The light emitting device of claim 21, wherein the two or more kinds of fluorescent materials emit light of colors complementary to each other.

24. The light emitting device of claim 22, wherein the two or more kinds of fluorescent materials emit light of colors complementary to each other.

25. The light emitting device of claim 11, wherein the fluorescent member includes a pigment having a body color similar to the color of light emitted from the fluorescent substance.

26. The light emitting device of claim 13, wherein the fluorescent member includes a pigment having a body color similar to the color of light emitted from the fluorescent substance.

27. The light emitting device of claim 11, wherein the fluorescent member is formed of a transparent synthetic resin material that has viscosity in a range from 2,500 mPa·s to 20,000 mPa·s.

28. The light emitting device of claim 13, wherein the fluorescent member is formed of a transparent synthetic resin material that has viscosity in a range from 2,500 mPa·s to 20,000 mPa·s.

29. The light emitting device of claim 11, wherein the fluorescent member is formed of a material mixed 40 to 100 parts by weight of the fluorescent substance with 100 parts by weight of the synthetic resin material.

30. The light emitting device of claim 13, wherein the fluorescent member is formed of a material mixed 40 to 100 parts by weight of the fluorescent substance with 100 parts by weight of the synthetic resin material.

31. The light emitting device of claim 11, wherein the fluorescent substance in the fluorescent member has mean particle size of ranging from 6 to 25 μm.

32. The light emitting device of claim 13, wherein the fluorescent substance in the fluorescent member has mean particle size of ranging from 6 to 25 μm.

33. The light emitting device of claim 11, wherein the fluorescent member is formed spontaneously by potting a transparent resin material including the fluorescent substance mixed therein.

34. The light emitting device of claim 13, wherein the fluorescent member is formed spontaneously by potting a transparent resin material including the fluorescent substance mixed therein.

35. The light emitting device of claim 11, further comprising a sealing resin for sealing the semiconductor light emitting element.

36. The light emitting device of claim 13, further comprising a sealing resin for sealing the semiconductor light emitting element.

37. The light emitting device of claim 11, wherein a light diffusion member for diffusing light is provided above the semiconductor light emitting element.

38. The light emitting device of claim 13, wherein a light diffusion member for diffusing light is provided above the semiconductor light emitting element.

39. The light emitting device of claim 11, wherein a light collecting member for collecting light is provided above the semiconductor light emitting element.

40. The light emitting device of claim 13, wherein a light collecting member for collecting light is provided above the semiconductor light emitting element.

41. A light emitting device comprising:
a semiconductor light emitting element emitting at least part of light from side faces thereof;
a fluorescent member provided at a distance from the semiconductor light emitting element; the fluorescent member being capable of emitting light by wavelength-conversion due to absorption of part of light emitted from the semiconductor light emitting element and including at least yttrium aluminum garnet fluorescent substance as a component having at least one element selected from the group consisting of Y, Lu, Sc, La, Gd and Sm, at least one element selected from the group consisting of Al, Ga and In, at least Ce and at least one element selected from the group consisting of Pr, Sm, Cu, Ag, Au, Fe, Cr, Nd, Dy, Ni, Ti, Tb and Eu; and
a sealing member formed of transparent material which is different from the fluorescent member, the sealing member being provided between the semiconductor light emitting element and the fluorescent member;
wherein the fluorescent member has a first portion at a first distance from the semiconductor light emitting element and a second portion at a second distance farther than the first distance from the semiconductor light emitting element and the first portion has a higher efficiency of absorption of light emitted from the semiconductor light emitting element than that of the second portion.

42. A light emitting device comprising:
a semiconductor light emitting element emitting at least part of light from side faces thereof;
a fluorescent member provided at a distance from the semiconductor light emitting element; the fluorescent member being capable of emitting light by wavelength-conversion due to absorption of part of light emitted from the semiconductor light emitting element and including at least yttrium aluminum garnet fluorescent substance as a component having at least one element selected from the group consisting of Y, Lu, Sc, La, Gd and Sm, at least one element selected from the group consisting of Al, Ga and In, at least Ce and at least one element selected from the group consisting of Pr, Sm, Cu, Ag, Au, Fe, Cr, Nd, Dy, Ni, Ti, Tb and Eu; and
a sealing member formed of transparent material which is different from the fluorescent member, the sealing member being provided between the semiconductor light emitting element and the fluorescent member so that light emitted from the semiconductor light emitting element can pass through the sealing member to the fluorescent member;

wherein the fluorescent member has a first portion at a first distance from the semiconductor light emitting element and a second portion at a second distance farther than the first distance from the semiconductor light emitting element and the first portion has a higher efficiency of absorption of light emitted from the semiconductor light emitting element than that of the second portion.

43. A light emitting device comprising:

a semiconductor light emitting element emitting at least part of light from side faces thereof; and a fluorescent member provided at a distance from the semiconductor light emitting element; the fluorescent member being capable of emitting light by wavelength-conversion due to absorption of part of light emitted from the semiconductor light emitting element and including at least yttrium aluminum garnet fluorescent substance as a component having at least one element selected from the group consisting of Y, Lu, Sc, La, Gd and Sm, at least one element selected from the group consisting of Al, Ga and In, at least Ce and at least one element selected from the group consisting of Pr, Sm, Cu, Ag, Au, Fe, Cr, Nd, Dy, Ni, Ti, Th and Eu;

wherein the fluorescent member has a first portion at a first distance from the semiconductor light emitting element and a second portion at a second distance farther than the first distance from the semiconductor light emitting element and the first portion has a higher efficiency of absorption of light emitted from the semiconductor light emitting element than that of the second portion, and the fluorescent member is provided near the side faces of the semiconductor light emitting element and has a flat or curved surface that reflects light emitted from the semiconductor light emitting element.

44. A light emitting device comprising:

a semiconductor light emitting element emitting at least part of light from side faces thereof;

a fluorescent member provided at a distance from the semiconductor light emitting element; the fluorescent member being capable of emitting light by wavelength-conversion due to absorption of part of light emitted from the semiconductor light emitting element; and a sealing member formed of transparent material which is different from the fluorescent member, the sealing member being provided between the semiconductor light emitting element and the fluorescent member;

wherein the fluorescent member has a first portion at a first distance from the semiconductor light emitting element and a second portion at a second distance farther than the first distance from the semiconductor light emitting element and the first portion has a higher efficiency of absorption of light emitted from the semiconductor light emitting element than that of the second portion.

45. A light emitting device comprising:

a semiconductor light emitting element emitting at least part of light from side faces thereof;

a fluorescent member provided at a distance from the semiconductor light emitting element; the fluorescent member being capable of emitting light by wavelength-conversion due to absorption of part of light emitted from the semiconductor light emitting element; and a sealing member formed of transparent material which is different from the fluorescent member, the sealing member being provided between the semiconductor light emitting element and the fluorescent member so that light emitted from the semiconductor light emitting element can pass through the sealing member to the fluorescent member;

wherein the fluorescent member has a first portion at a first distance from the semiconductor light emitting element and a second portion at a second distance farther than the first distance from the semiconductor light emitting element and the first portion has a higher efficiency of absorption of light emitted from the semiconductor light emitting element than that of the second portion.

46. A light emitting device comprising:

a semiconductor light emitting element emitting at least part of light from side faces thereof; and a fluorescent member provided at a distance from the semiconductor light emitting element; the fluorescent member being capable of emitting light by wavelength-conversion due to absorption of part of light emitted from the semiconductor light emitting element;

wherein the fluorescent member has a first portion at a first distance from the semiconductor light emitting element and a second portion at a second distance farther than the first distance from the semiconductor light emitting element and the first portion has a higher efficiency of absorption of light emitted from the semiconductor light emitting element than that of the second portion, and the fluorescent member is provided near the side faces of the semiconductor light emitting element and has a flat or curved surface that reflects light emitted from the semiconductor light emitting element.

* * * * *